(12) United States Patent
Klemar et al.

(10) Patent No.: US 6,741,069 B1
(45) Date of Patent: May 25, 2004

(54) DETECTOR FOR HIGH INTENSITY ELECTRICAL CURRENTS

(75) Inventors: Benny Aaris Klemar, Viby J (DK); Henrik Færch, Højbjerg (DK)

(73) Assignee: Vestas Wind Systems A/S, Lem (DK)

( * ) Notice: Subject to any disclaimer, the term of this patent is extended or adjusted under 35 U.S.C. 154(b) by 0 days.

(21) Appl. No.: 10/111,754

(22) PCT Filed: Nov. 3, 1999

(86) PCT No.: PCT/DK99/00597

§ 371 (c)(1), (2), (4) Date: Apr. 30, 2002

(87) PCT Pub. No.: WO01/33234

PCT Pub. Date: May 10, 2001

(51) Int. Cl.$^7$ ................................................ G01R 31/02
(52) U.S. Cl. ....................................................... 324/72
(58) Field of Search ........................ 324/72, 106, 1.74, 324/126, 127, 96; 340/310.06, 310.07

(56) References Cited

U.S. PATENT DOCUMENTS 4,886,980 A * 12/1989 Fernandes et al. ............. 307/64

FOREIGN PATENT DOCUMENTS

| EP | 08227788 | 9/1996 |
|----|----------|--------|
| EP | 0 757 797 B1 | 2/1997 |
| EP | 10027670 | 1/1998 |

* cited by examiner

*Primary Examiner*—Emmanuel L. Moise
*Assistant Examiner*—James Kerveros
(74) *Attorney, Agent, or Firm*—Stites & Harbison, PLLC; Ross F. Hunt, Jr.

(57) ABSTRACT

The invention discloses a detection- and recording system for high intensity electric currents such as lighting currents in a lighting conductor in a wind turbine. The system comprises a detector (6) containing a power supply (7), a measuring circuit (8), and a converter means (9) and furthermore a recording means (11) non-galvanically coupled to said converter means (9) and a measuring coil (5) to be inductively coupled to an electric conductor (2) carrying the high intensity electric current. The power supply (7) receives its electrical energy directly from the lighting current via the power coil (4) which makes the system non-sensitive to mains supply drop-outs.

10 Claims, 1 Drawing Sheet

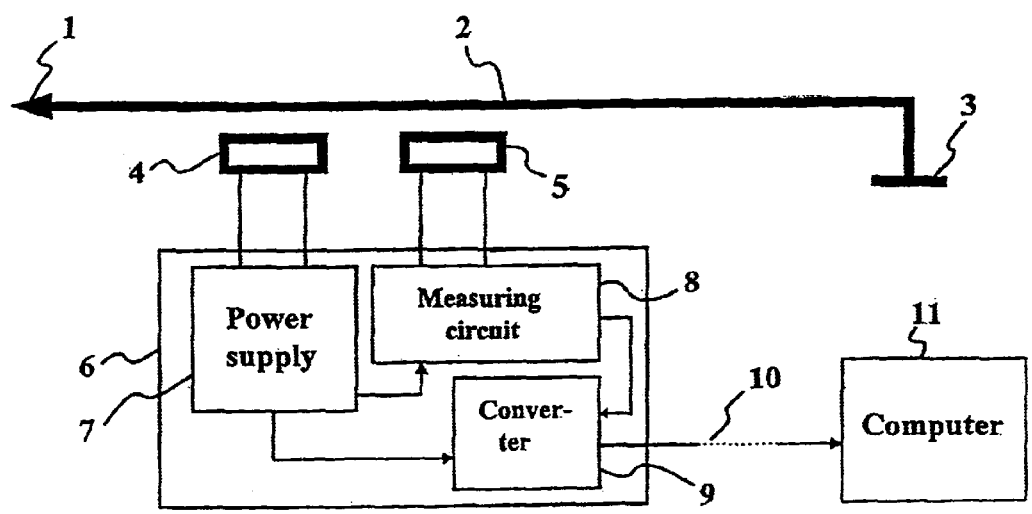

DETECTOR FOR HIGH INTENSITY ELECTRICAL CURRENTS

TECHNICAL FIELD

The present invention relates generally to detection and recording of high intensity electrical currents and more particularly to detection and recording of lightning currents flowing in a lightning conductor for instance in a wind turbine.

BACKGROUND ART

In order to guarantee adequate maintenance of systems which could potentially be subjected to unwanted high intensity electric currents flowing through the system, for instance if the system forms part of the lightning current path in a lightning conductor, it is often required continuously to monitor the system and to measure and record the intensity of lightning currents, the date of the lightning current and the number of the occurrences of lightning currents within a given period of time.

A method and an apparatus for measuring and recording a lightning current in a lightning conductor is disclosed in EP757797 ("Method for monitoring lightning protection equipment"). This apparatus basically comprises a magnetic core around the lightning conductor such that a lightning current flowing in the lightning conductor will generate a magnetic field in the core. A winding is disposed around said core such that said magnetic field by means of induction will generate an electric current in the winding. The winding is coupled to a measuring circuit and a recording circuit which records the intensity of the lightning current and the date of the lightning current. These circuits are powered by means of a power supply. Furthermore the recorded data can be forwarded to a telephone line via a non-galvanic coupling (for security reasons).

U.S. Pat. No. 5,892,430 furthermore discloses a self-powered powerline sensor comprising a core layer for wrapping about an AC powerline, a winding layer comprising a number of windings to be energised by the AC current flowing in the powerline and disposed about the core layer, means for sensing relevant conditions in said AC powerline and means powered by said windings and in communication with said sensing means for transmitting a signal representing said conditions in the AC powerline.

Furthermore U.S. Pat. No. 4,904,996 discloses a mobile monitoring system for moving on a conductor of an AC powerline and comprising front and rear propulsion modules surrounding said conductor and used to carry the monitoring equipment between them. This equipment comprises means such as video and infrared cameras and means for detecting problems and dysfunctions on the powerline. The equipment also comprises transmitter means for communication with a ground receiver.

Finally JP 8227788 A discloses a lightning surge measurement system for use in high voltage transmission installations comprising a detection coil the signals from which are converted into optical signals and transmitted to a ground station through a optical fibre.

In order to guarantee un-interrupted operation of a monitoring system for lightning protectors it is important that the power supply which supply monitoring circuits with electric energy should be protected against failure for instance caused by a power line drop-out, a failure which might remain unnoticed for a period of time. One method of circumventing such problems is to provide the system with some kind of power supply backup means, but a more advantageous solution would be to be able to avoid a power line driven power supply altogether. The present invention addresses this possibility.

DISCLOSURE OF THE INVENTION

It is the object of the present invention to provide a detector for high intensity electric currents such as lightning currents in a lightning conductor for instance in a wind turbine, said detector continuously monitoring lightning currents in the lightning conductor where said detector provides improved reliability, in that the power needed by the detector means is provided by the lightning current itself instead of by a power supply coupled to the mains supply. This object is achieved with the aid of a system comprising the features set forth in the charactersing clause of claim 1. One specific embodiment hereof is defined in claim 2.

It is a further object of the present invention to provide a safe and reliable transmission of data from said detector to succeeding recording and/or processing equipment located at a remote position relative to the detector. This object is achieved according to the features set forth in the characterising clause of claim 3.

Further advantageous embodiments of the invention are described in the remaining of the independent claims.

The advantageous effect of the present invention is that the operation of the detector is independent of external power supply, so that its operation remains unaffected by for instance dropouts of mains voltage. Such dropouts are typical in connection with lightning activity and in some places mains supply is even deliberately shut-down during lightning activity. Dropouts of mains supply during lightning activity is thus a typical situation.

BRIEF DESCRIPTION OF THE DRAWINGS

The invention will now be described by way of exemplifying embodiments hereof and with reference to the accompanying drawing where:

FIG. 1 is a schematic block diagram of a lightning current path and associated lightning detector connected to a computer as used in a wind turbine according to the invention.

DETAILED DESCRIPTION OF THE INVENTION

Referring to FIG. 1 there is shown an embodiment of the present invention specifically to be used in a wind turbine. The figure schematically shows a lightning conductor 2 located inside each of the blades of the wind turbine and connecting the tip of the blade 1 in a manner known per se via parts of the mechanical components of the wind turbine (nor shown on the drawing) to ground 3.

The detector 6 comprise an internal power supply 7 for the detector itself, a measuring circuit 8 which measures the intensity of the lightning current flowing in the lightning conductor 2 located in the blade of the wind turbine and a converter means 9 receiving the output signal from the measuring circuit 8 and converting this signal into a suitable form to be transmitted via the non-galvanic connection to a recording and/or processing means, here shown as the computer 11. One suitable means of transmission of signals between the detector 6 and the recording/procession means 11 would be by means of an optical fibre. In this case the converter means 9 should convert for instance the electrical-output signal from the measuring circuit 8, being a function of the intensity of the lightning current, into a light signal of an intensity and spectral composition suitable for the following optical fibre 10. A corresponding inverse converter means (not shown) would then be provided at the recording/processing means 11.

The input to the measuring circuit 8 consist in the embodiment shown in FIG. 1 of an electrical signal provided by a measuring coil 5 placed in close proximity to the lightning conductor 2, such that a lightning current flowing in the lightning conductor 2 by way of induction generates a voltage across the two terminals of the measuring coil 5. A construction of the measuring coil resembling the arrangement shown in above-mentioned EP757797 could for instance be used, although somebody skilled in the art could conceive many other layouts.

A very essential part of the present invention is the power supply 7 which in the present embodiment is being provided with electrical energy from the lightning current via the power coil 4, across the terminals of which a voltage is rapidly built up, as soon as a lightning current begins to flow through the lightning conductor. The power supply 7 provides DC voltages to the measuring circuit 8 and the converter means 9. It is a requirement that the power supply 7 is capable of providing these DC voltages as soon as the measuring circuit 8 and the converter means 9 commences their operations, as well as it is required that the power supply 7 must be able to maintain the necessary DC voltage levels throughout the period of time, in which the measuring circuit 8 and the converter means 9 should be functioning. The dynamics of the power supply 7 and its power coil 4 must thus be optimised to the dynamics of the measuring circuit 8 and the converter means 9.

The present invention has been described above with reference to one specific embodiment hereof, but it should be understood that other embodiments for instance of the connection means between the lightning current and the power supply 4 and/or between the converter means 9 and the recording/processing means 11 which would be conceivable by somebody skilled in the art would also fall within the scope of the present invention.

What is claimed is:

1. A detection and recording system for lightning currents in a lightning conductor comprising a detector at least containing a power supply, a measuring circuit and a converter means, said measuring circuit and converter means being supplied with electrical energy from said power supply, and where said system furthermore comprises a recording means non-galvanically coupled to said converter means (9) for receiving data regarding said lightning current from said detector, and a measuring coil connected to said measuring circuit and inductively coupled to said lightning conductor, characterized in that said power supply receives its electric energy from said lightning currents via a non-galvanic coupling between said lightning conductor and said power supply, and where the dynamic properties of said power supply are such that it is capable of providing said converter means with the required electrical energy throughout the period of time during which said converter means is required to function in order to transfer data regarding said lightning current from said detector to said recording means.

2. A detection and recording system according to claim 1, characterized in that said non-galvanic coupling is an inductive coupling provided via a power coil.

3. A detection and recording system according to claim 2, characterized in that said measuring coil and said power coil are combined into one common coil.

4. A detection and recording system according to claim 2, wherein said measuring coil and said power coil are combined into one common coil.

5. A detection and recording system according to claim 1, characterized in that said measuring circuit measures the intensity of said lightning current.

6. A detection and recording system according to claim 1, characterized that said recording means records the number of lightnings and the time of occurrence of these lightnings.

7. A detection and recording system for detecting lightning currents and for recording data regarding the lightning currents, said system comprising a detector at least including a power supply, a measuring circuit and a converter means, said measuring circuit and converter means being supplied with electrical energy from said power supply, and said system further comprising a recording means non-galvanically coupled to said converter means for receiving data regarding the lightning currents from said detector, and a measuring coil connected to said measuring circuit and inductively coupled to said lightning conductor, said power supply receiving its electric energy from the lightning currents via a non-galvanic coupling between the lightning conductor and said power supply, and the power supply having dynamic properties such that, based on a voltage rapidly built up in said non-galvanic coupling and derived from the lightning currents flowing in the lightning conductor, the power supply is capable of providing said converter means with the required electrical energy throughout the period of time during which said converter means is required to function in order to transfer the data regarding lightning currents from said detector to said recording means.

8. A detection and recording system according to claim 7, wherein said non-galvanic coupling is an inductive coupling provided via a power coil.

9. A detection and recording system according to claim 7, wherein said measuring circuit measures the intensity of said lightning current.

10. A detection and recording system according to claim 7, wherein said recording means records the number of lightnings and the time of occurrence of these lightnings.

* * * * *